United States Patent
Zhou

(10) Patent No.: US 9,369,099 B1
(45) Date of Patent: Jun. 14, 2016

(54) LOW POWER OPERATIONAL TRANSCONDUCTANCE AMPLIFIER

(71) Applicant: QUALCOMM Incorporated, San Diego, CA (US)

(72) Inventor: Qubo Zhou, San Diego, CA (US)

( * ) Notice: Subject to any disclaimer, the term of this patent is extended or adjusted under 35 U.S.C. 154(b) by 0 days.

(21) Appl. No.: 14/566,539

(22) Filed: Dec. 10, 2014

(51) Int. Cl.
*H03F 3/45* (2006.01)
*H03M 3/00* (2006.01)

(52) U.S. Cl.
CPC .......... *H03F 3/45179* (2013.01); *H03M 3/458* (2013.01); *H03F 2203/45024* (2013.01); *H03F 2203/45034* (2013.01); *H03F 2203/45058* (2013.01)

(58) Field of Classification Search
CPC ........................................ H03F 3/45
USPC .................................. 330/253, 302
See application file for complete search history.

(56) References Cited

U.S. PATENT DOCUMENTS

| | | | | |
|---|---|---|---|---|
| 5,384,501 A * | 1/1995 | Koyama | ................. | G06G 7/184 327/336 |
| 5,631,598 A * | 5/1997 | Miranda | ................. | G05F 1/565 327/483 |
| 5,834,976 A * | 11/1998 | Tomasini | ................ | H03F 1/086 330/292 |
| 6,191,637 B1 * | 2/2001 | Lewicki | .................. | G05F 3/245 323/316 |
| 6,335,655 B1 * | 1/2002 | Yamamoto | ......... | H03H 11/0422 327/103 |
| 7,049,894 B1 | 5/2006 | Aram | | |
| 7,248,117 B1 | 7/2007 | Li et al. | | |
| 7,907,011 B2 | 3/2011 | Chung | | |
| 8,035,450 B2 | 10/2011 | Barbieri et al. | | |
| 2008/0220735 A1 | 9/2008 | Kim et al. | | |
| 2008/0272844 A1 * | 11/2008 | Rayanakorn | ............ | H03F 1/483 330/253 |
| 2009/0224829 A1 * | 9/2009 | Johansson | ........... | H03F 3/45183 330/252 |
| 2009/0295477 A1 * | 12/2009 | Dasgupta | .................. | H03F 1/14 330/253 |

FOREIGN PATENT DOCUMENTS

WO 2008103757 8/2008

OTHER PUBLICATIONS

Palmisano G., et al., "An Optimized Miller Compensation Based on Voltage Buffer," 1995, pp. 1034-1037.
Azzolini C., et al., "Accurate Transient Response Model for Automatic Synthesis of High-speed Operational Amplifiers," 2006 IEEE International Symposium on Circuits and Systems May 21-24, 2006 Island of Kos, Greece, IEEE—Piscataway. NJ. USA. May 21, 2006, pp. 5716-5719, XP032459056.
International Search Report and Written Opinion—PCT/US2015/057366—ISA/EPO—Feb. 4, 2016.

* cited by examiner

*Primary Examiner* — Patricia T Nguyen
(74) *Attorney, Agent, or Firm* — Arent Fox LLP

(57) ABSTRACT

A method and an apparatus relating to an amplifier (e.g., an operational transconductance amplifier or OTA) are provided. The OTA includes a first node and a second node. The OTA further includes a differential transistor pair for receiving an input. The differential transistor pair is coupled to the first node and the second node. The OTA includes a pair of output nodes for outputting a response to the input. The response at the pair of output nodes includes a first frequency pole. A capacitive element is coupled between the first node and the second node. The response includes a second frequency pole based on the capacitive element. The second frequency pole is at a greater frequency than the first frequency pole.

26 Claims, 7 Drawing Sheets

LOW POWER OPERATIONAL TRANSCONDUCTANCE AMPLIFIER

BACKGROUND

1. Field

The present disclosure relates generally to electronic circuits, and more particularly, to a low power operational transconductance amplifier (OTA).

2. Background

Wireless communication technologies and mobile electronic devices (e.g., cellular phones, tablets, laptops, etc.) have grown in popularity and use over the past several years. Increasingly, mobile electronic devices have grown in complexity and now commonly include multiple processors and other resources that allow mobile device users to execute complex and power intensive software applications (e.g., web browsers, video streaming applications, etc.).

With the ever increasing demand for more processing capability in mobile devices, low power consumption has become a common design requirement for the components of the mobile electronic devices. OTA is a key component of wireless technology today. For example, a wireless transceiver may use a delta-sigma analog-to-digital converter (ADC) to digitize a received analog signal. An OTA may be used for an integrator for such delta-sigma ADC. To meet the timing requirement of the delta-sigma ADC, the OTA may require large power consumption. Typically, the OTA demands more power than other delta-sigma ADC components.

SUMMARY

In an aspect of the disclosure, a method and an apparatus relating to an OTA are provided. The OTA includes a first node and a second node. The OTA further includes a differential transistor pair for receiving an input. The differential transistor pair is coupled to the first node and the second node. The OTA includes a pair of output nodes for outputting a response to the input. The response at the pair of output nodes includes a first frequency pole. A capacitive element is coupled between the first node and the second node. The response includes a second frequency pole based on the capacitive element. The second frequency pole is at a greater frequency than the first frequency pole.

DETAILED DESCRIPTION

Figure 1:
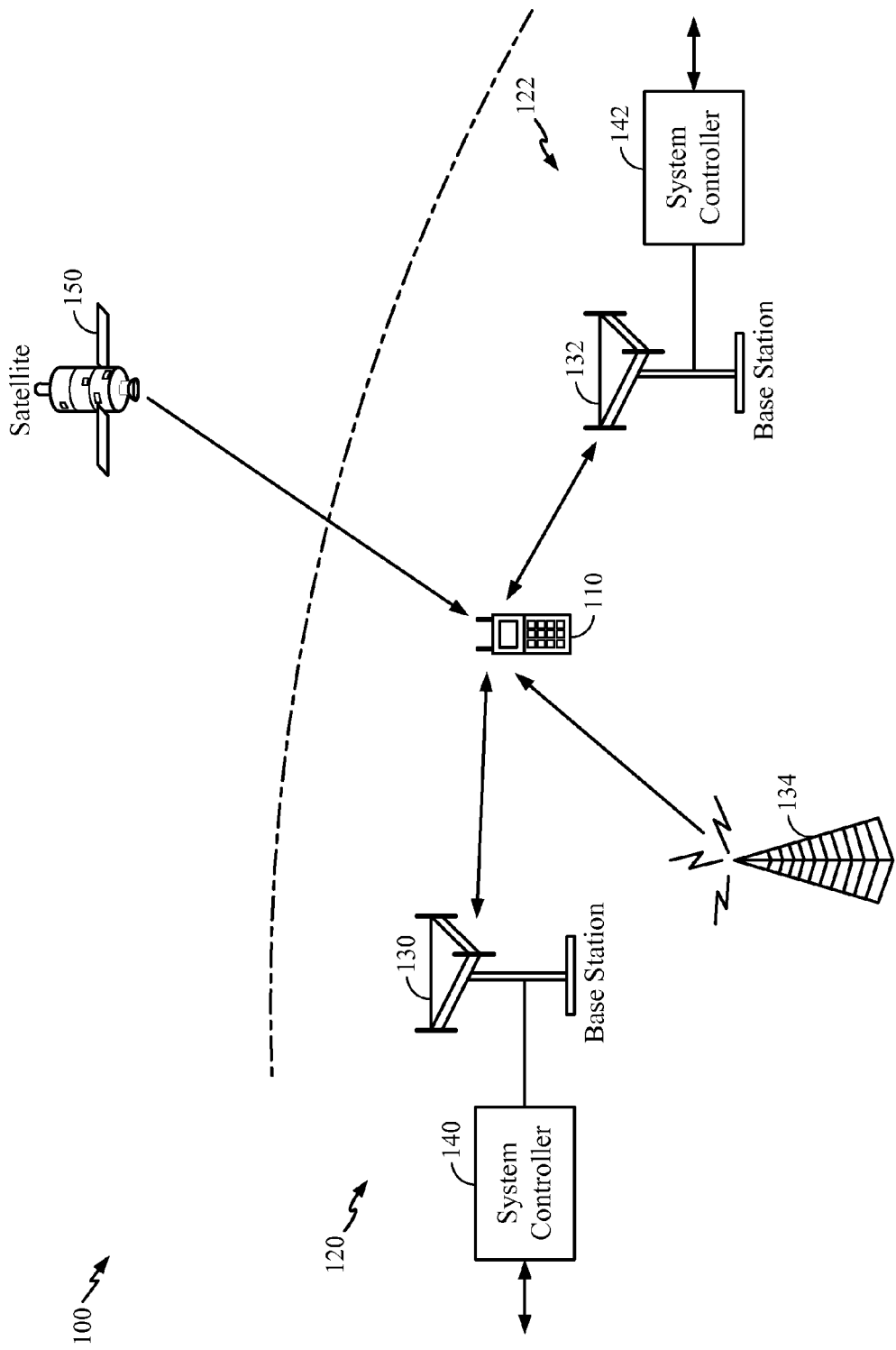
FIG. 1 illustrates a wireless device and systems in which an exemplary embodiment may be included.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. The term "exemplary" is used herein to mean "serving as an example, instance, or illustration." Any design described herein as "exemplary" is not necessarily to be construed as preferred or advantageous over other designs.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise random-access memory (RAM), read-only memory (ROM), electronically erasable programmable ROM (EEPROM), compact disk (CD) ROM (CD-ROM), or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

FIG. 1 illustrates a wireless device (e.g., wireless device 110) and systems (e.g., wireless systems 120, 122) in which an exemplary embodiment may be included. The wireless device 110 communicates with different wireless systems 120, 122. The wireless systems 120, 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), CDMA 1× or cdma2000, Time Division Synchronous Code Division Multiple Access (TD-SCDMA), or some other version of CDMA. TD-SCDMA is also referred to as Universal Terrestrial Radio Access (UTRA) Time Division Duplex (TDD) 1.28 Mcps Option or Low Chip Rate (LCR). LTE supports both frequency division duplexing (FDD) and time division duplexing (TDD). For example, the wireless system 120 may be a GSM system, and the wireless system 122 may be a WCDMA system. As another example, the wireless system 120 may be an LTE system, and the wireless system 122 may be a CDMA system.

For simplicity, the diagram 100 shows the wireless system 120 including one base station 130 and one system controller 140, and the wireless system 122 including one base station 132 and one system controller 142. In general, each wireless system may include any number of base stations and any set of network entities. Each base station may support communication for wireless devices within the coverage of the base station. The base stations may also be referred to as a Node B, an evolved Node B (eNB), an access point, a base transceiver station, a radio base station, a radio transceiver, a transceiver function, a basic service set (BSS), an extended service set (ESS), or some other suitable terminology. The wireless device 110 may also be referred to as a user equipment (UE), a mobile device, a remote device, a wireless device, a wireless communications device, a station, a mobile station, a subscriber station, a mobile subscriber station, a terminal, a mobile terminal, a remote terminal, a wireless terminal, an access terminal, a client, a mobile client, a mobile unit, a subscriber unit, a wireless unit, a remote unit, a handset, a user agent, or some other suitable terminology. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, or some other similar functioning device.

The wireless device 110 may be capable of communicating with the wireless system 120 and/or 122. The wireless device 110 may also be capable of receiving signals from broadcast stations, such as the broadcast station 134. The wireless device 110 may also be capable of receiving signals from satellites, such as the satellite 150, in one or more global navigation satellite systems (GNSS). The wireless device 110 may support one or more radio technologies for wireless communication such as GSM, WCDMA, cdma2000, LTE, 802.11, etc. The terms "radio technology," "radio access technology," "air interface," and "standard" may be used interchangeably.

The wireless device 110 may communicate with a base station in a wireless system via the downlink and the uplink. The downlink (or forward link) refers to the communication link from the base station to the wireless device, and the uplink (or reverse link) refers to the communication link from the wireless device to the base station. A wireless system may utilize TDD and/or FDD. For TDD, the downlink and the uplink share the same frequency, and downlink transmissions and uplink transmissions may be sent on the same frequency in different time periods. For FDD, the downlink and the uplink are allocated separate frequencies. Downlink transmissions may be sent on one frequency, and uplink transmissions may be sent on another frequency. Some exemplary radio technologies supporting TDD include GSM, LTE, and TD-SCDMA. Some exemplary radio technologies supporting FDD include WCDMA, cdma2000, and LTE.

Figure 2:
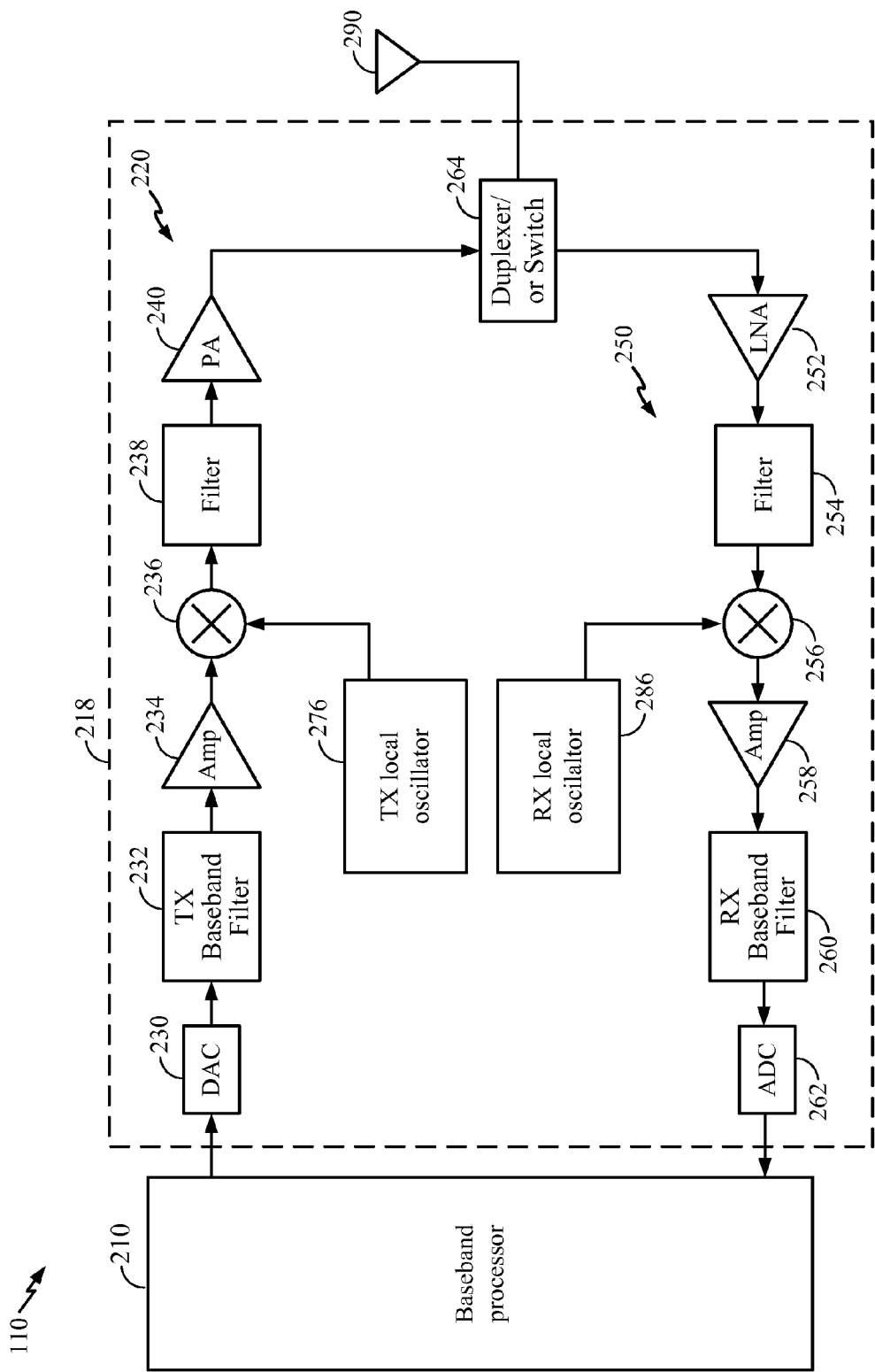
FIG. 2 is a block diagram of a portion of a wireless device in which an exemplary embodiment may be included.

FIG. 2 is a block diagram of a portion of a wireless device (e.g., wireless device 110) in which an exemplary embodiment may be included. The wireless transceiver 218 includes a transmitter 220 and a receiver 250 that support bi-directional communication. The transmitter 220 and/or the receiver 250 may be implemented with a super-heterodyne architecture or direct-conversion architecture. In the super-heterodyne architecture, a signal is frequency converted between RF and baseband in multiple stages (e.g., from RF to an intermediate frequency (IF) in one stage, and then from IF to baseband in another stage for a receiver). In the direct-conversion architecture, which is also referred to as a zero-IF architecture, a signal is frequency converted between RF and baseband in one stage. The super-heterodyne and direct-conversion architectures may use different circuit blocks and/or have different requirements. In the exemplary embodiment shown in FIG. 2, the transmitter 220 and the receiver 250 are implemented with a direct-conversion architecture.

In the transmit path, the baseband processor 210 provides data to a digital-to-analog converter (DAC) 230. The DAC 230 converts a digital input signal to an analog output signal. The analog output signal is provided to a filter 232, which filters the analog output signal to remove images caused by the prior digital-to-analog conversion by the DAC 230. An amplifier 234 is used to amplify the signal from the filter 232 to provide an amplified baseband signal. A mixer 236 receives the amplified baseband signal and an LO signal from TX local oscillator 276. The mixer 236 mixes the amplified baseband signal with the LO signal to provide an upconverted signal. A filter 238 is used to filter the upconverted signal to remove images caused by the frequency mixing. A power amplifier (PA) 240 is used to amplify the signal from the filter 238 to obtain an output RF signal at the desired output power level. The output RF signal is routed through a duplexer 264 to the antenna 290 for transmission over the wireless channel.

In the receive path, the antenna 290 may receive signals transmitted by a remote device. The received RF signal may be routed through the duplexer 264 to the receiver 250. Within the receiver 250, the received RF signal is amplified by a low noise amplifier (LNA) 252 and filtered by a filter 254 to obtain an input RF signal. A mixer 256 receives the input RF signal and an LO signal from a RX local oscillator 286. The mixer 256 mixes the input RF signal with the LO signal to provide a downconverted signal. The downconverted signal is amplified by an amplifier 258 to obtain an amplified downconverted signal. A filter 260 is used to filter the amplified downconverted signal to remove images caused by the frequency mixing. The signal from the filter 260 is provided to an ADC 262. The ADC 262 converts the signal to a digital output signal. The digital output signal may be provided to the baseband processor 210 for further processing. The ADC 262 may be a delta-sigma type ADC including an exemplary embodiment of an OTA performing the integration function.

The conditioning of the signals in the transmitter 220 and the receiver 250 may be performed by one or more stages of amplifiers, filters, mixers, etc. These circuits may be arranged differently from the configuration shown in FIG. 2. Furthermore, other circuits not shown in FIG. 2 may also be used to condition the signals in the transmitter 220 and the receiver 250. For example, impedance matching circuits may be located at the output of the PA 240, at the input of the LNA 252, between the antenna 290 and the duplexer 264, etc.

Figure 3:
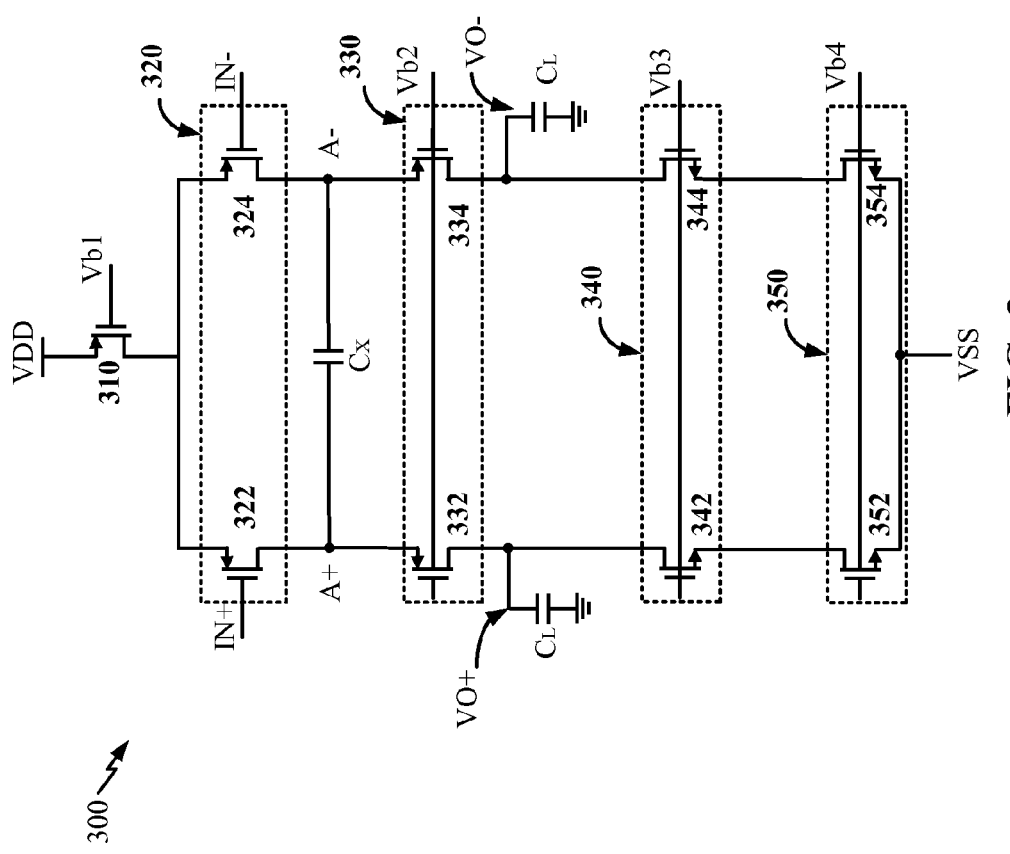
FIG. 3 illustrates an exemplary embodiment OTA.

FIG. 3 illustrates an exemplary embodiment OTA (e.g., OTA 300). The OTA 300 may be a single-stage, telescopic cascode operational amplifier receiving a differential input at nodes IN+ and IN− and outputting a differential output at nodes VO+ and VO−. The OTA includes a differential transistor pair 320 for receiving a differential input. The differential transistor pair 320 includes P-type metal-oxide-semiconductor (PMOS) transistors 322 and 324. In one example, the differential transistor pair 320 provides the input means for receiving the (differential) input. The differential transistor pair 320 is coupled (e.g., electrically connected) to a PMOS transistor 310, which is coupled to a supply voltage VDD and provides the current to the OTA 300. The gate of the PMOS transistor 310 is coupled a reference voltage Vb1. The gate of the PMOS transistor 322 receives the input from the node IN+. The drain of the PMOS transistor 322 is coupled to the node A+. The gate of the PMOS transistor 324 receives the input from the node IN−. The drain of the PMOS transistor 324 is coupled to the node A−. Thus, the differential transistor pair 320 is coupled or electrically connected to the nodes A+ and A−. Example of the nodes (e.g., A+ and A−; N+ and N−) may include conductive portions (metal, polysilicon, etc.) connecting the differential transistor pair 320 and a first cascode pair 330.

A capacitive element (e.g., the second frequency pole capacitor $C_X$) is coupled (e.g., electrically connected) to the nodes A+ and A−. In one example, the capacitance of second frequency pole capacitor $C_X$ ranges from 100 fF to 200 fF. The differential transistor pair 320 is further coupled to a first cascode pair 330 at the nodes A+ and A−. The first cascode pair 330 includes PMOS transistors 332 and 334. The PMOS transistor 332 is coupled to the node A+ and the output node VO+. The PMOS transistor 334 is coupled to the node A− and the output node VO−. Both the gates of the PMOS transistors 332 and 334 are coupled to a reference voltage Vb2. Each of the output nodes VO+ and VO− is coupled to a load capacitor $C_L$. In one example, the output nodes VO+ and VO− provide the output means for outputting the response of the OTA 300. Examples of the output nodes VO+ and VO− may include conductive portions (metal, polysilicon, etc.) connecting the first cascode pair 330 and a second cascode pair 340.

The load of the OTA 300 may include a resistor or at least one current source (e.g., second cascode pair 340 and current source pair 350) coupled (e.g., electrically connected) to the output nodes VO+ and VO. The second cascode pair 340 includes an N-type metal-oxide-semiconductor (NMOS) transistor 342 coupled to the output node VO+ and an NMOS transistor 344 coupled to the output node VO−. The gates of the NMOS transistors 342 and 344 are coupled to a reference voltage Vb3. The current source pair 350 includes an NMOS transistor 352 coupled to the output node VO+ (via the NMOS transistor 342) and an NMOS transistor 354 coupled to the output node VO− (via the NMOS transistor 344). The gates of the NMOS transistors 352 and 354 are coupled to a reference voltage Vb4. The second cascode pair 340 and the current source pair 350 are coupled to VSS, which may be ground (GND). Thus, in one example, the second cascode pair 340 and/or the current source pair 350 provide the means to flow currents through the differential transistor pair 320 and the output nodes VO+ and VO−.

The reference voltages Vb1, Vb2, Vb3, and Vb4 are configured to control the bias current flowing through the OTA 300, and may be generated with known voltage generators in the art. As would be understood by persons of ordinary skill in the art, the types of the transistors in the OTA 300 may be reversed (e.g., the differential transistor pair 320 may be NMOS transistors, and the load may be PMOS cascode pairs).

Figure 4:
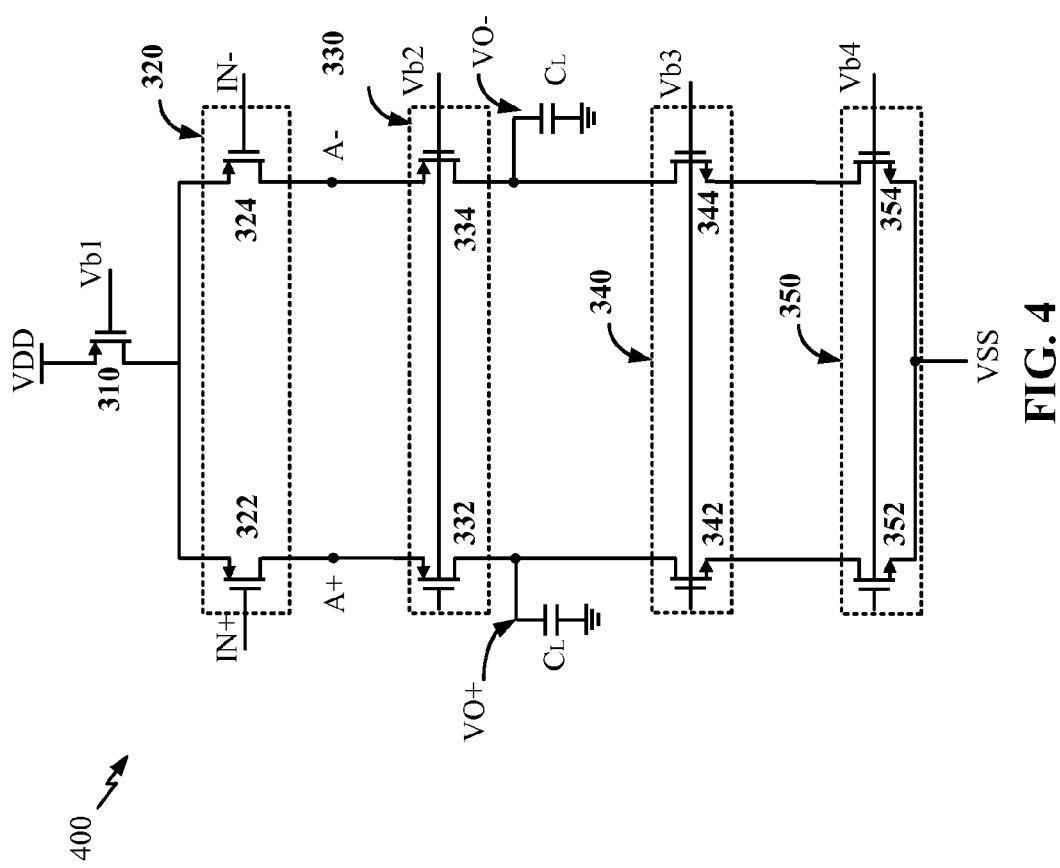
FIG. 4 illustrates an OTA without the second frequency pole capacitor.

In one aspect of the OTA 300, the second frequency pole capacitor $C_X$ introduces a second frequency pole to the response of the OTA 300. Thus, the OTA 300 is a single-stage, telescopic cascode OTA with a first frequency pole and a second frequency pole in its response. For comparison, FIG. 4 illustrates an OTA 400 without the second frequency pole capacitor $C_X$. In one example, the OTA 400 is identical to the OTA 300 except for lacking the second frequency pole capacitor $C_X$. The OTA 400 is a single-stage, telescopic cascode OTA with a single pole in its response. The OTA 300 will be described in comparison with the OTA 400.

Referring to FIG. 3, an exemplary embodiment OTA may include a first node (e.g., A+) and a second node (e.g., A−). The exemplary embodiment OTA may include a differential transistor pair (e.g., 320) for receiving an input. The differential transistor pair is coupled to the first node (e.g., A+) and the second node (e.g., A−). For example, the differential transistor pair 320 may include PMOS transistors 322 and 324. The PMOS transistors 322 and 324 receive the input at nodes IN+ and IN−. The drain of the PMOS transistor 322 is connected to first node (node A+), and the drain of the PMOS transistor 324 is connected to the second node (node A−). The exemplary embodiment OTA may further include a pair of output nodes (e.g., VO+ and VO−) for outputting a response to the input. The response at the pair of output nodes includes a first frequency pole. See, e.g., FIG. 5 at frequency $f_1$ (described below). The exemplary embodiment OTA may further include a capacitive element (e.g., second frequency pole capacitor $C_X$) coupled between the first node (A+) and the second node (A−). The response of the exemplary embodiment OTA may include a second frequency pole, which is a function of the capacitive element. The second frequency pole (frequency $f_2$) is at a greater frequency than the first frequency pole (frequency $f_1$). See e.g., frequency $f_2$ of FIG. 5 described below.

The exemplary embodiment OTA may further include at least one capacitive load coupled to the pair of output nodes (VO+ and VO−). See e.g., the load capacitors $C_L$ connected to the output nodes VO+ and VO−. The second frequency pole (frequency $f_2$) is a function of the at least one capacitive load (see FIG. 2 and the accompanying description below). The exemplary embodiment OTA may further include a cascode transistor pair (e.g., 330) coupled to the pair of output nodes (VO+ and VO−). The pair of output nodes is coupled to the differential transistor pair via the cascode transistor pair. For the example, the cascode transistor pair 330 includes PMOS transistors 332 and 334. The drain of the PMOS transistor 332 is connected to the output node VO+, and the drain of the PMOS transistor 334 is connected to the output node VO−. The output nodes VO+ and VO− are connected to the differential transistor pair 320 via the cascode transistor pair 330. The differential transistor pair 320 and the cascode transistor pair 330 may include MOS transistors of a first type (e.g., PMOS transistors).

The exemplary embodiment OTA may further include a second cascode transistor pair (e.g., 340) coupled to the cascode transistor pair. The second cascode transistor pair includes MOS transistors of a second type (e.g., NMOS transistors). For example, the second cascode transistor pair 340 includes NMOS transistors 342 and 344. The drain of the NMOS transistor 342 is connected to the drain of the PMOS transistor 332 of the cascode transistor pair 330, and the drain of the NMOS transistor 344 is connected to the drain of the PMOS transistor 334 of the cascode transistor pair 330. Moreover, in the exemplary embodiment OTA, the capacitive element (e.g, second frequency pole capacitor $C_X$) and the at least one capacitive load (e.g, $C_L$) includes capacitors of a same type. For example, the second frequency pole capacitor $C_X$ and the capacitive load $C_L$ may both include metal-insulator-semiconductor capacitors.

The exemplary embodiment OTA may further include a gain of the response, a capacitance of the capacitive element, and a capacitance of the at least one capacitive load such that a phase margin of the response is approximately 40-90 degrees (see the FIG. 5 description below). The exemplary embodiment OTA may further to perform an integration function of a sigma-delta analog-to-digital conversion. For example, the ADC 262 may be a sigma-delta ADC and includes an exemplary embodiment OTA, which performs the integration function. Moreover, the exemplary OTA may be a single stage OTA, as shown in FIG. 3.

Referring to FIG. 3, an exemplary embodiment OTA may include means for receiving an input at a differential transistor pair. Such means may include, for example, the nodes A+ and A−. The exemplary embodiment OTA may further include means for flowing currents through a pair of output nodes (e.g., VO+ and VO−). A capacitive element (e.g., $C_L$) is coupled to the pair of output nodes. For example, such means may include PMOS transistor 310, which operates to flow currents through the nodes A+ and A−. The exemplary embodiment OTA may further include means for outputting, at the pair of output nodes, a response having a first frequency pole and a second frequency pole. The second frequency pole is a function of the capacitive element, and the second frequency pole is at a greater frequency than the first frequency pole. For example, the second frequency pole $C_X$ operates to output, at the pair of output modes VO+ and VO−, a response having a first frequency pole (at frequency $f_1$) and a second frequency pole (at frequency $f_2$). See FIG. 5 and the accompanying description below. The second frequency pole (at frequency $f_2$) is a function of the capacitive element $C_X$, and the second frequency pole (at frequency $f_2$) is at a greater frequency than the first frequency pole (at frequency $f_1$).

The exemplary embodiment OTA may further include means for flowing currents through a cascode transistor pair (e.g., 330) coupled to the pair of output nodes (e.g., VO+ and VO−). The pair of output nodes is coupled to the differential transistor pair via the cascode transistor pair. For example, such means may include the connection for providing the reference voltage Vb2 to the cascode transistor pair 330. The connection providing the reference voltage Vb2 flows currents through cascode transistor pair 330. The exemplary embodiment OTA may further include means for flowing currents through a second cascode transistor pair (e.g., 340) coupled to the cascode transistor pair. The (second) cascode transistor pair 340 includes MOS transistors of a second type (e.g., NMOS). Such means may include the connection for providing the reference voltage Vb3 to the cascode transistor pair 340. The connection providing the reference voltage Vb3 flows currents through cascode transistor pair 340. The exemplary embodiment OTA may further include means for perform an integration function of a sigma-delta analog-to-digital conversion. For example, the ADC 262 may be a sigma-delta ADC containing the OTA 300. The connections to the OTA 300 within the ADC 262 provide the means to perform the integration function of a sigma-delta analog-to-digital conversion.

Figure 5:
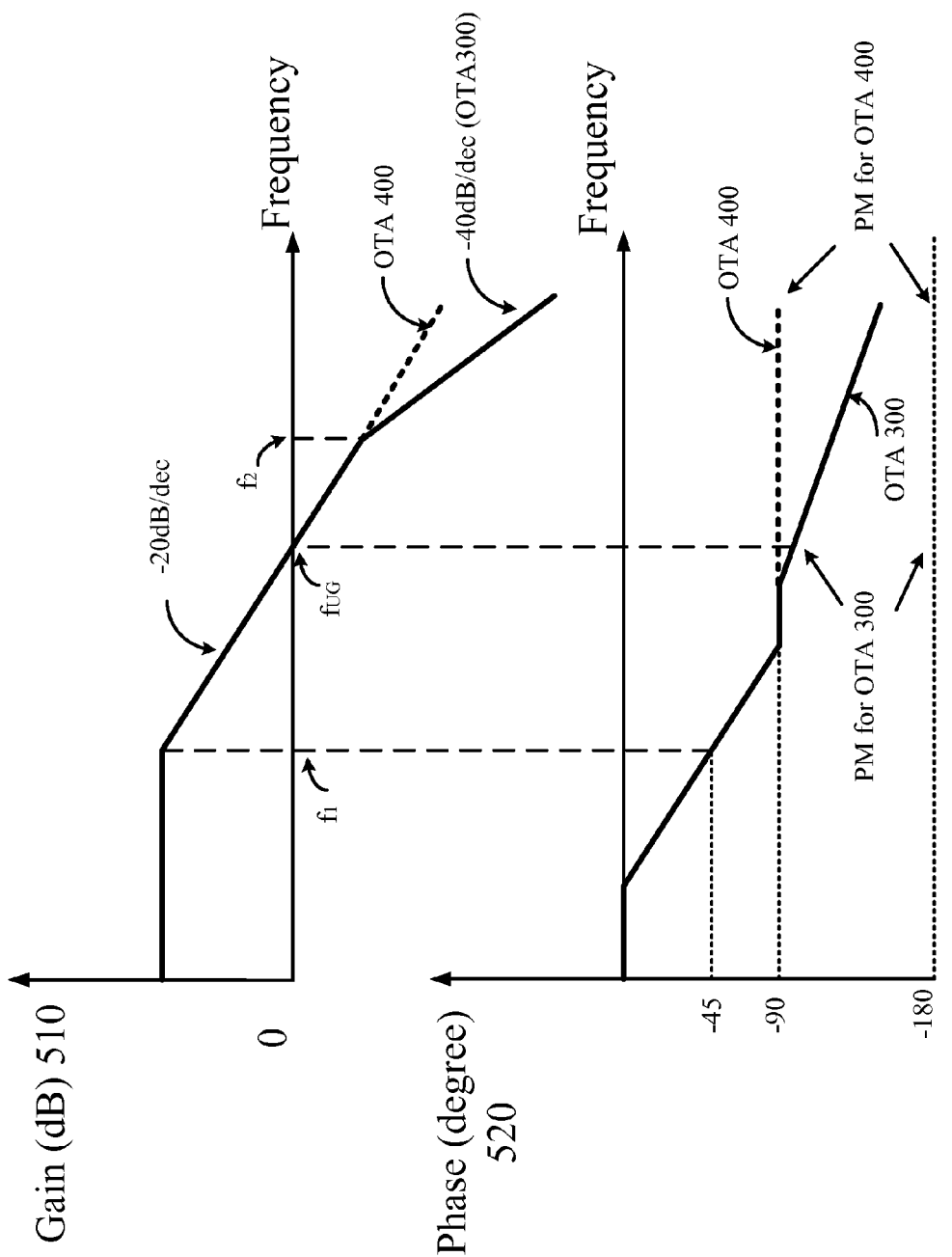
FIG. 5 illustrates Bode plots comparing the responses of an OTA with the second frequency pole capacitor and an OTA without the second frequency pole capacitor.

FIG. 5 illustrates Bode plots comparing the responses of the OTA 300 with the second frequency pole capacitor and the OTA 400 without the second frequency pole capacitor. Plot 510 illustrates the gains (in decibel or dB) of the responses vs. frequency. Plot 520 illustrates the phases (in degree) of the responses vs. frequency. At the first pole frequency $f_1$, the gain starts to decrease at a slope of −20 dB/dec. The phase is at −45°. In one example, the first frequency pole is a function of transconductance $g_m/C_L$. In another example, the first frequency pole is $1/R_{OUT} \times C_L$, where $R_{OUT}$ is the output resistance of the OTA 300 in the example. The transconductance $g_m$ is an example of a gain of the response of the OTA 300. At the unity gain frequency $f_{UG}$, the gain is at 0 dB (unity gain). For the single-poled OTA 400, the gain continues to decrease at the −20 dB/dec slope, and the phase is stabilized at −90°. Thus, the phase margin of the OTA 400 would be at 90° (the difference between the phases of −90° and −180°. For the OTA 300, the second frequency pole in the response occurs at frequency $f_2$. The gain changes slope to −40 dB/dec. In one example, the second frequency pole is a function of transconductance $g_m/C_X$. A phase margin of the OTA 300 may be measured at frequency $f_{UG}$. At the frequency $f_{UG}$, the phase margin is the difference in the phase of the OTA 300 to the −180°, which is less than 90°. In one example, the phase margin of the OTA 300 is between 70° to 90°, and still meets the performance requirement (e.g., response time). As illustrated, the response of the OTA 300 includes a first frequency pole at $f_1$ and a second frequency pole at $f_2$, and $f_2$ is at a greater frequency than $f_1$.

Figure 6:
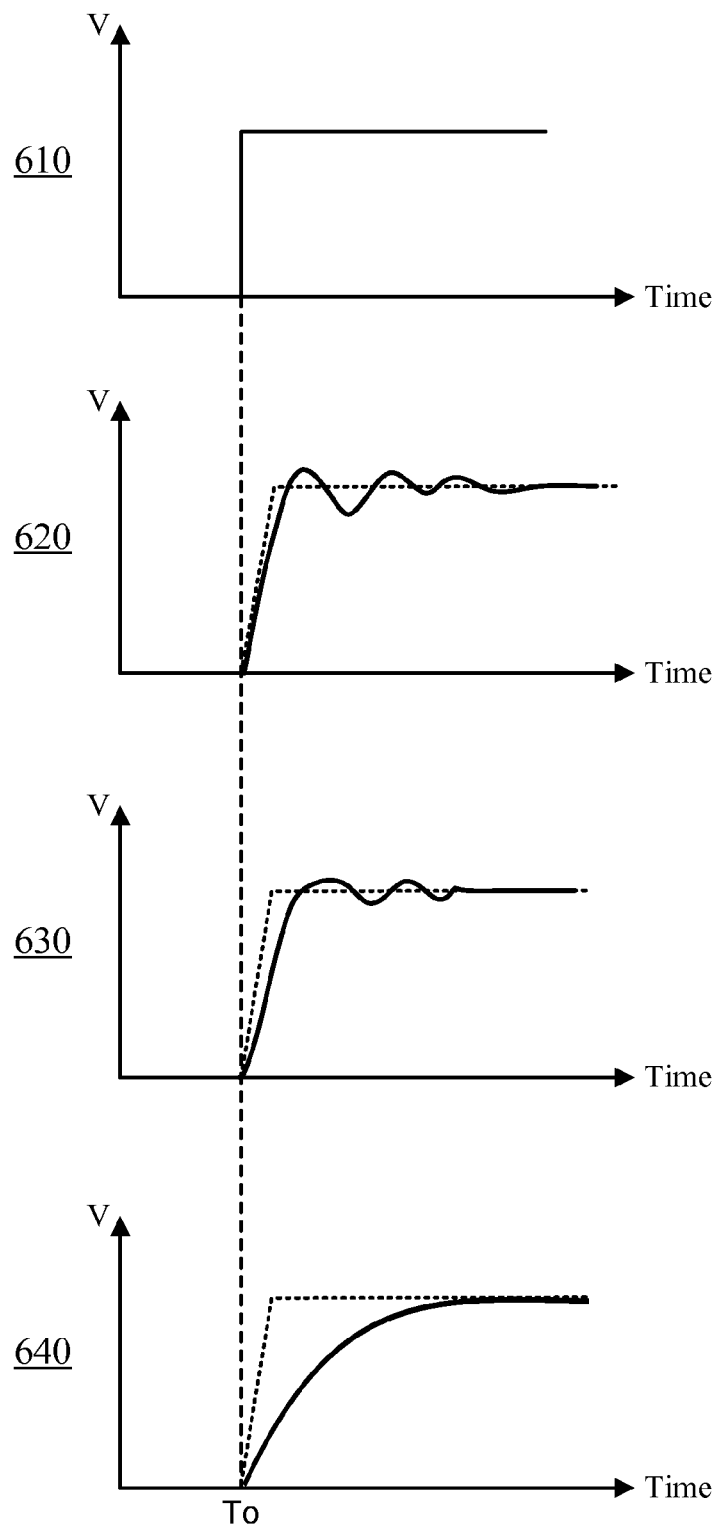
FIG. 6 illustrates various OTA responses based on the phase margins.

One of the features of the second frequency pole introduced by the second frequency pole capacitor $C_X$ may be the reduced phase margin shown in FIG. 5. FIG. 6 illustrates various OTA responses based on the phase margins. Diagram 610 is the input. Diagrams 620-640 are the responses at various phase margins with responses without ringing shown in dotted lines. Diagram 620 is a response to the input shown in the diagram 610 at a phase margin of 45°. An example of the response of the OTA 300 may be similar to diagram 620. Diagram 630 is a response to the input shown in the diagram 610 at a phase margin of 70°. An example of the response of the OTA 300 may be similar to diagram 630. Diagram 640 is a response to the input shown in diagram 610 at a phase margin of 90°. Therefore, the response of the OTA 400 may be similar to the diagram 640. As show in diagrams 610-640, as the phase margin decreases, the response time improves. However, ringing in the responses increases, resulting in increased error as compared to the response without ringing. In one example, the OTA 300 at the phase margin of between 40° to 90° has a faster response time than the OTA 400. Thus, the operating current of the OTA 300 may be reduced to achieve a power saving, and still meet the performance requirement.

In one example, the value of the second frequency pole capacitor $C_X$ may be a function of the transconductance $g_m$ of the OTA 300, the value of the load capacitor $C_L$, and the phase margin. The addition of the second frequency pole capacitor $C_X$ may not greatly affect the phase margin. Thus, one feature of the OTA 300 provides that the phase margin may be determined and adjusted relatively easily by adjusting the values of the load capacitor $C_L$ (therefore the transconductance $g_m$) and the second frequency pole capacitor $C_X$. The second frequency pole capacitor $C_X$ and the load capacitor $C_L$ may be the same type of the capacitors. For example, they may both be metal-insulator-metal capacitors. In this manner, the same phase margin may be maintained over the corner conditions (e.g., voltage and temperature corners), since both frequency poles are dominated by the same type of capacitors.

The response of the OTA 300 may be described as follows:

$$BW \approx g_m/C_L,$$

where the bandwidth BW is approximately a ratio of $g_m$ and $C_L$. In one example, the phase margin is targeted at 70°, and $C_X$ is set to 100 fF-200 fF. The error in response is as follows:

$$|err_{norm}| = \left(e^{-\sqrt{3.3}*\left(\frac{g_m}{C_L}\right)*t}/0.415\right)*\sin[0.828((g_m/C_L)*t) + 0.428],$$

where $err_{norm}$ is a difference between the actual response and an ideal response (e.g., a response without ringing), and t is the time.

The addition of the second frequency pole capacitor $C_X$ may not greatly affect other parameters of the OTA 300, such as the slew-rate, noise, linearity, common-mode rejection ratio (CMRR), and power supply rejection ratio (PSRR.) For comparison, the response of the OTA 400, without the second frequency pole capacitor $C_X$, may be described as follows:

$$BW = g_m/C_L,$$

where the BW is the bandwidth of the OTA 400. In one example, the phase margin is targeted at 90°. The error in response is as follows:

$$|err_{norm}| = \left(e^{-t*\left(\frac{g_m}{C_L}\right)}\right),$$

where $err_{norm}$ is a difference between the actual response and an ideal response, and t is the time.

Figure 7:
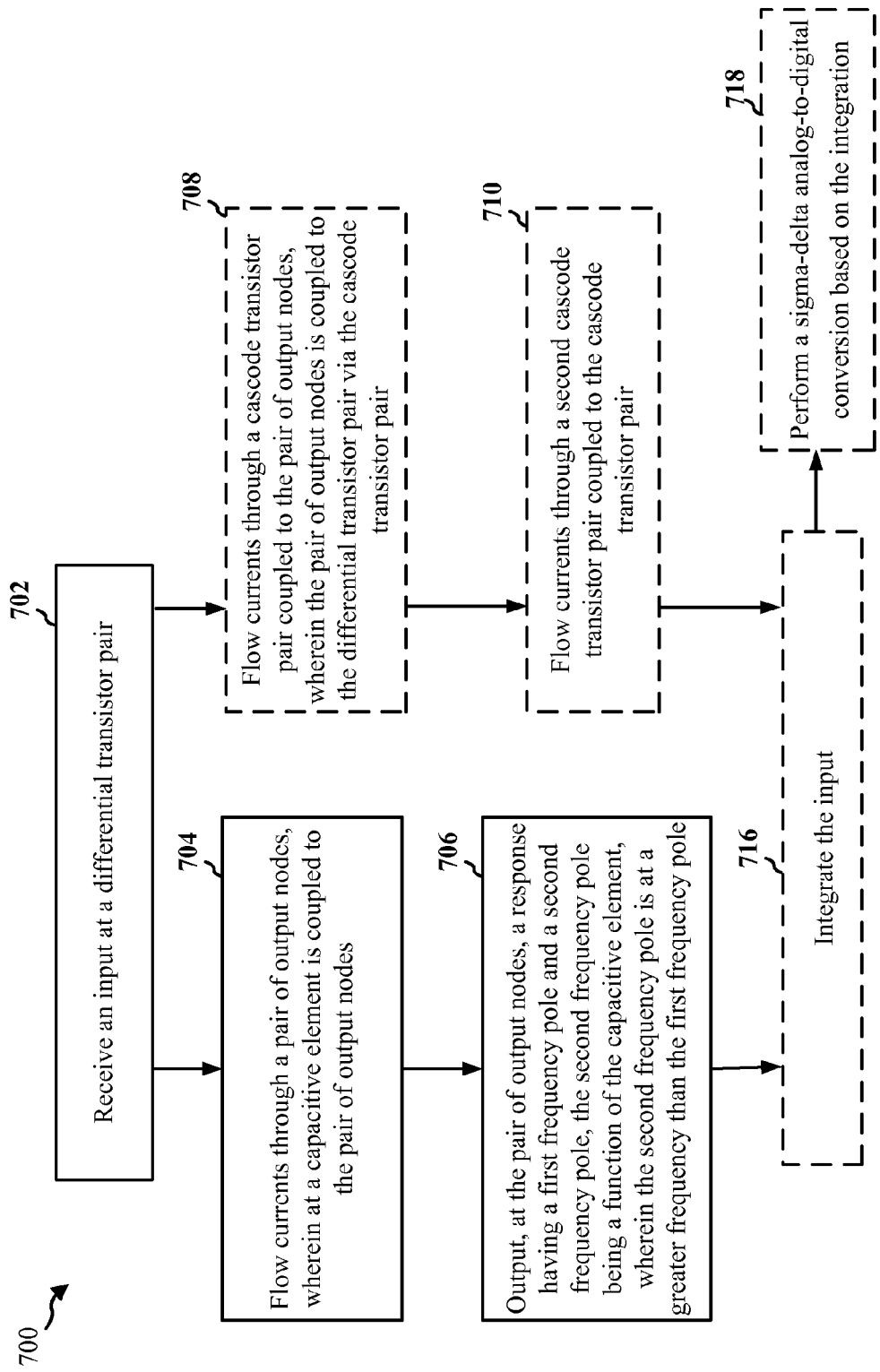
FIG. 7 is the flow chart of the operations of an exemplary embodiment OTA.

FIG. 7 is the flow chart 700 of the operations of an exemplary embodiment OTA (e.g., OTA 300). Steps shown in dotted-lines may be optional. At 702, an input is received at a differential transistor pair (e.g., FIG. 3, 320). At 704, currents are flowed through a pair of output nodes. (e.g., FIG. 3, VO+ and VO−). A capacitive element (e.g., FIG. 3, $C_X$) is coupled to the pair of output nodes. At 706, a response is outputted at the pair of output nodes. The response has a first frequency pole and a second frequency pole (e.g., FIG. 5 at $f_1$ and $f_2$). The second frequency pole is a function of the capacitive element. The second frequency pole is at a greater frequency than the first frequency pole. At 708, currents are flowed through a cascode transistor pair (e.g., FIG. 3, 330) coupled to the pair of output nodes. The pair of output nodes is coupled to the differential transistor pair via the cascode transistor pair. At 710, currents are flowed through a second cascode transistor pair coupled to the cascode transistor pair (e.g., FIG. 3, 340). At 716, the received input is integrated. At 718, a sigma-delta analog-to-digital conversion is performed based on the integration (FIG. 2, ADC 262). Examples of these steps are described with FIGS. 2-6 and the accompany description.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An operational transconductance amplifier (OTA), comprising:
   a first node and a second node;
   a differential transistor pair for receiving a differential input, wherein the differential transistor pair is coupled to the first node and the second node;
   a pair of output nodes for outputting a response to the differential input, wherein the response at the pair of output nodes comprises a first frequency pole;
   a capacitive element coupled between the first node and the second node, wherein the response includes a second frequency pole, the second frequency pole being a function of the capacitive element, and wherein the second frequency pole is at a greater frequency than the first frequency pole.

2. The OTA of claim 1, further comprising at least one capacitive load coupled to the pair of output nodes, wherein the second frequency pole is a function of the at least one capacitive load.

3. The OTA of claim 2, further comprising a cascode transistor pair coupled to the pair of output nodes, wherein the pair of output nodes is coupled to the differential transistor pair via the cascode transistor pair.

4. The OTA of claim 3, wherein the differential transistor pair and the cascode transistor pair comprise metal oxide semiconductor (MOS) transistors of a first type.

5. The OTA of claim 4, further comprising a second cascode transistor pair coupled to the cascode transistor pair, wherein the second cascode transistor pair comprises metal oxide semiconductor (MOS) transistors of a second type.

6. The OTA of claim 2, wherein the capacitive element and the at least one capacitive load comprise capacitors of a same type.

7. The OTA of claim 2, wherein a gain of the response, a capacitance of the capacitive element, and a capacitance of the at least one capacitive load are configured such that a phase margin of the response is approximately 40-90 degrees.

8. The OTA of claim 1, wherein the OTA is configured to perform an integration function of a sigma-delta analog-to-digital conversion.

9. The OTA of claim 1, wherein the OTA is single stage.

10. A method for an operational transconductance amplifier (OTA), comprising:
    receiving a differential input at a differential transistor pair;
    flowing currents through a pair of output nodes, wherein a capacitive element is coupled to the pair of output nodes; and
    outputting, at the pair of output nodes, a response having a first frequency pole and a second frequency pole, the second frequency pole being a function of the capacitive element, and wherein the second frequency pole is at a greater frequency than the first frequency pole.

11. The method of claim 10, wherein the second frequency pole is a function of at least one capacitive load coupled to the pair of output nodes.

12. The method of claim 11, further comprising flowing currents through a cascode transistor pair coupled to the pair of output nodes, wherein the pair of output nodes is coupled to the differential transistor pair via the cascode transistor pair.

13. The method of claim 12, wherein the differential transistor pair and the cascode transistor pair comprise metal oxide semiconductor (MOS) transistors of a first type.

14. The method of claim 13, further comprising flowing currents through a second cascode transistor pair coupled to the cascode transistor pair, wherein the second cascode transistor pair comprises metal oxide semiconductor (MOS) transistors of a second type.

15. The method of claim 11, wherein the capacitive element and the at least one capacitive load comprise capacitors of a same type.

16. The method of claim 11, wherein a gain of the response, a capacitance of the capacitive element, and a capacitance of the at least one capacitive load are configured such that a phase margin of the response is approximately 40-90 degrees.

17. The method of claim 10, further comprising:
   integrating the differential input; and
   performing a sigma-delta analog-to-digital conversion based on the integration.

18. An operational transconductance amplifier (OTA), comprising:
   means for receiving a differential input at a differential transistor pair;
   means for flowing currents through a pair of output nodes, wherein a capacitive element is coupled to the pair of output nodes; and
   means for outputting, at the pair of output nodes, a response having a first frequency pole and a second frequency pole, the second frequency pole being a function of the capacitive element, and wherein the second frequency pole is at a greater frequency than the first frequency pole.

19. The OTA of claim 18, wherein the second frequency pole is a function of at least one capacitive load coupled to the pair of output nodes.

20. The OTA of claim 19, further comprising means for flowing currents through a cascode transistor pair coupled to the pair of output nodes, wherein the pair of output nodes is coupled to the differential transistor pair via the cascode transistor pair.

21. The OTA of claim 20, wherein the differential transistor pair and the cascode transistor pair comprise metal oxide semiconductor (MOS) transistors of a first type.

22. The OTA of claim 21, further comprising means for flowing currents through a second cascode transistor pair coupled to the cascode transistor pair, wherein the second cascode transistor pair comprises metal oxide semiconductor (MOS) transistors of a second type.

23. The OTA of claim 19, wherein the capacitive element and the at least one capacitive load comprise capacitors of a same type.

24. The OTA of claim 19, wherein a gain of the response, a capacitance of the capacitive element, and a capacitance of the at least one capacitive load are configured such that a phase margin of the response is approximately 40-90 degrees.

25. The OTA of claim 18, further comprising means for perform an integration function of a sigma-delta analog-to-digital conversion.

26. The OTA of claim 18, wherein the OTA is single stage.

* * * * *